(12) United States Patent
Myong et al.

(10) Patent No.: US 9,130,102 B2
(45) Date of Patent: Sep. 8, 2015

(54) INTEGRATED THIN FILM PHOTOVOLTAIC MODULE AND MANUFACTURING METHOD THEREOF

(75) Inventors: Seung-Yeop Myong, Seoul (KR); La-Sun Jeon, Seoul (KR)

(73) Assignee: Intellectual Discovery Co., Ltd., Seoul (KR)

( * ) Notice: Subject to any disclaimer, the term of this patent is extended or adjusted under 35 U.S.C. 154(b) by 379 days.

(21) Appl. No.: 13/477,623

(22) Filed: May 22, 2012

(65) Prior Publication Data
US 2013/0312815 A1 Nov. 28, 2013

(51) Int. Cl.
H01L 31/05 (2014.01)
H01L 31/0687 (2012.01)
H01L 31/18 (2006.01)
H01L 31/054 (2014.01)

(52) U.S. Cl.
CPC ........ *H01L 31/0687* (2013.01); *H01L 31/0549* (2014.12); *H01L 31/18* (2013.01); *Y02E 10/52* (2013.01); *Y02E 10/544* (2013.01)

(58) Field of Classification Search
USPC ................................. 136/244, 246, 252, 256
See application file for complete search history.

(56) References Cited

U.S. PATENT DOCUMENTS

| 6,265,652 | B1 | 7/2001 | Kurata et al. |
| 2009/0065060 | A1 | 3/2009 | Yonezawa et al. |
| 2010/0147361 | A1 | 6/2010 | Chen |
| 2010/0180925 | A1* | 7/2010 | Nasuno et al. ............... 136/244 |
| 2011/0041889 | A1* | 2/2011 | Murata ........................ 136/244 |

FOREIGN PATENT DOCUMENTS

| JP | H11186573 A * | 7/1999 |
| JP | 2002094089 | 3/2002 |
| JP | 2002261308 A * | 9/2002 |
| JP | 2009-049227 | 3/2009 |
| JP | 2011-155041 | 8/2011 |
| KR | 10-2009-0080171 | 7/2009 |

OTHER PUBLICATIONS

Meguro et al. JP2002261308A, machine translation.*
Hayashi JPH11186573A, English equivalent of the abstract.*
Non-Final Office Action issued on Dec. 2, 2014, in U.S. Appl. No. 13/483,870.
Notice of Allowance issued on Jun. 22, 2015, in U.S. Appl. No. 13/483,870.

* cited by examiner

*Primary Examiner* — Susan D Leong
(74) *Attorney, Agent, or Firm* — H.C. Park & Associates, PLC

(57) ABSTRACT

Disclosed is an integrated thin-film photovoltaic module. The integrated thin-film photovoltaic module includes a first cell and a second cell, all of which are formed respectively by stacking on a substrate a lower electrode, a photoelectric conversion layer and an upper electrode, wherein the lower electrode of the first cell and the lower electrode of the second cell are separated by a lower electrode separation groove, wherein a plurality of through holes are formed to be spaced from each other in the upper electrode and the photoelectric conversion layer of the first cell, and wherein the through hole is filled with a conductive material such that the upper electrode of the second cell is connected with the lower electrode of the first cell.

17 Claims, 11 Drawing Sheets
(1 of 11 Drawing Sheet(s) Filed in Color)

INTEGRATED THIN FILM PHOTOVOLTAIC MODULE AND MANUFACTURING METHOD THEREOF

FIELD OF THE INVENTION

The present invention relates to an integrated thin-film photovoltaic module and a manufacturing method thereof.

BACKGROUND OF THE INVENTION

Recently, as existing energy resources like oil and coal and the like are expected to be exhausted, much attention is increasingly paid to alternative energy sources which can be used in place of the existing energy sources. As an alternative energy sources, sunlight energy is abundant and has no environmental pollution. Therefore, more and more attention is paid to the sunlight energy.

A photovoltaic module converting sunlight energy into electrical energy has a junction structure of a p-type semiconductor and an n-type semiconductor. When light is incident on the photovoltaic module, an electron with a negative electric charge and a hole with a positive electric charge are generated by interaction between the light and a material constituting the semiconductor of the photovoltaic module. Then, electric current flows while the electron and the hole move.

Depending on the thickness of the semiconductor of the photovoltaic module, the photovoltaic module is classified into a bulk type photovoltaic module and a thin-film type photovoltaic module. The thin-film type photovoltaic module includes a photovoltaic material layer of which the thickness is equal to or less than from several tens of micrometers to several micrometers.

At present, a bulk type silicon photovoltaic module is mainly and widely used for ground power. However, the recent increase of the demand for the bulk type silicon photovoltaic module is now increasing its price due to the lack of its raw material.

Therefore, in recent times, providing an integrated thin-film photovoltaic module has become the most important issue, which has high energy conversion efficiency and can be mass produced at a low cost. However, a single-junction thin-film photovoltaic module is limited in its achievable performance. Accordingly, a double junction thin-film photovoltaic module or a triple junction thin-film photovoltaic module having a plurality of stacked unit cells has been developed, pursuing high stabilized efficiency. The double junction thin-film photovoltaic module and the triple junction thin-film photovoltaic module are called a tandem type photovoltaic module.

In addition to this, researches are now being devoted to an integration technology for the photovoltaic module in order to improve the efficiency of the thin-film photovoltaic module by reducing the ineffective area thereof.

SUMMARY OF THE INVENTION

One aspect of the present invention is an integrated thin-film photovoltaic module including a first cell and a second cell, all of which are formed respectively by stacking on a substrate a lower electrode, a photoelectric conversion layer and an upper electrode, wherein the lower electrode of the first cell and the lower electrode of the second cell are separated by a lower electrode separation groove, wherein a plurality of through holes are formed to be spaced from each other in the upper electrode and the photoelectric conversion layer of the first cell, and wherein the through hole is filled with a conductive material such that the upper electrode of the second cell is connected with the lower electrode of the first cell.

In the integrated thin-film photovoltaic module according to one embodiment of the present invention, the photoelectric conversion layer includes the photoelectric conversion layer comprises a first unit cell layer, a second unit cell layer and an intermediate reflector located between the first unit cell layer and the second unit cell layer. The side wall of the through hole is coated with an insulating material.

Another aspect of the present invention is a manufacturing method of an integrated thin-film photovoltaic module, the method including: forming a lower electrode layer on a substrate; forming a lower electrode separation groove separating the lower electrode layer into a lower electrode layer of a first cell and a lower electrode layer of a second cell; forming a photoelectric conversion layer on the lower electrode layer of the first cell and the lower electrode layer of the second cell; forming an upper electrode layer on the photoelectric conversion layer; forming a plurality of through holes which are spaced from each other and penetrate through the upper electrode layer and the photoelectric conversion layer on the lower electrode layer of the first cell; filling the through hole with a conductive material such that the upper electrode layer of the second cell is connected with the lower electrode layer of the first cell; and forming an upper separation groove which separates the upper electrode layer and the photoelectric conversion layer and of which a portion passes over the lower electrode separation groove.

Further another aspect of the present invention is a manufacturing method of an integrated thin-film photovoltaic module, the method including: forming a lower electrode layer on a substrate; forming a photoelectric conversion layer on the lower electrode layer; forming an upper electrode layer on the photoelectric conversion layer; forming a separation groove separating the lower electrode layer, the photoelectric conversion layer and the upper electrode layer into a lower electrode layer, a photoelectric conversion layer and an upper electrode layer of a first cell, and a lower electrode layer, a photoelectric conversion layer and an upper electrode layer of a second cell; forming a plurality of through holes which are spaced from each other and penetrate through the photoelectric conversion layer and the upper electrode layer of the first cell, wherein a portion of the through hole overlaps with the separation groove; and filling the through hole with a conductive material such that the upper electrode layer of the second cell is connected with the lower electrode layer of the first cell.

In the manufacturing method of an integrated thin-film photovoltaic module in accordance with another embodiment of the present invention, the forming the photoelectric conversion layer includes forming a first unit cell layer, an intermediate reflector and a second unit cell layer.

In the manufacturing method of an integrated thin-film photovoltaic module in accordance with another embodiment of the present invention, after the forming the through hole and before filling the through hole with the conductive material, the method further includes coating an insulating material on the side wall of the through hole and a portion of the side wall of the upper separation groove.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 6b is a cross sectional view taken along line c-c' of FIG. 6a.

FIG. 6c shows an enlarged view of a dotted-line quadrangular part "B" of FIG. 6a;

DETAILED DESCRIPTION OF THE INVENTION

Figure 1:
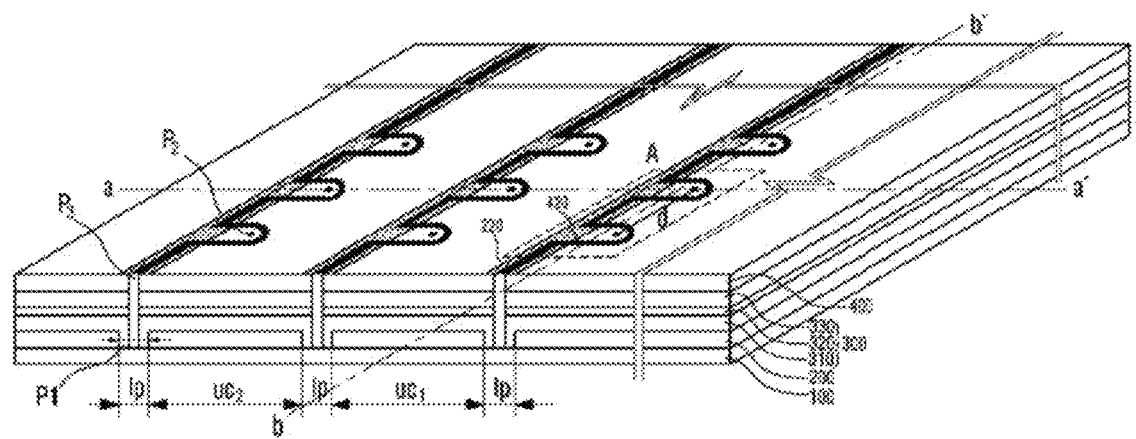
FIG. 1 is a perspective view showing an integrated thin-film photovoltaic module including photovoltaic cells which are connected in series through a point contact in accordance with a first embodiment of the present invention.

Hereafter, an exemplary embodiment of the present invention will be described in detail with reference to the accompanying drawings. Here, the embodiment of the present invention can be variously transformed, and the scope of the present invention is not limited to the following embodiment. The shapes and sizes of the components in the drawings may be exaggerated for clarity of the description. It is noted that the same reference numerals are used to denote the same elements throughout the drawings. In the following description of the present invention, the detailed description of known functions and configurations incorporated herein is omitted when it may make the subject matter of the present invention unclear.

FIG. 1 is a perspective view showing a photovoltaic module including photovoltaic cells which are connected in series through a point contact in accordance with a first embodiment of the present invention. Here, the shapes of a lower electrode separation groove $P_1$, a through hole $P_2$ and an upper separation groove $P_3$ are shown on the upper surface of the photovoltaic module in FIG. 1 and the following figures for convenience of description. The shapes may not be observed on the upper surface.

The photovoltaic module according to the first embodiment of the present invention includes a substrate 100, a lower electrode 200, a photoelectric conversion layer 300 and an upper electrode 400.

Here, the photoelectric conversion layer 300 may include a plurality of unit cell layers. For example, the photoelectric conversion layer 300 may include two stacked unit cell layers or three stacked unit cell layers. Each of the stacked unit cell layers is a basic unit layer capable of performing photoelectric conversion.

An intermediate reflector may be inserted between the stacked unit cell layers in order to maximize light trapping effect by enhancing internal reflection. For example, when the photoelectric conversion layer 300 includes two unit cell layers 310 and 330, the intermediate reflector 320 may be inserted between the two unit cell layers. Since the intermediate reflector 320 is located between the two unit cell layers, the intermediate reflector 320 may include a light transmitting material. The light transmitting material may include at least one of ZnO, ITO, SiO and $SnO_2$.

When the photoelectric conversion layer 300 includes a plurality of unit cell layers, each of the photovoltaic cells $UC_1$ and $UC_2$ connected in series to each other may have a structure formed by stacking a plurality of the unit cell layers 310 and 330. The open circuit voltage of the photovoltaic cell $UC_1$ and $UC_2$ is the sum of the open circuit voltages of the stacked unit cell layers 310 and 330. The short-circuit current of the unit cell $UC_1$ and $UC_2$ is a minimum value among the short-circuit currents of the stacked unit cell layers 310 and 330.

Hereafter, the photoelectric conversion layer 300 including the two unit cell layers 310 and 330 and the intermediate reflector 320 will be taken as an example for description of the embodiment of the present invention. However, the photoelectric conversion layer 300 including only one unit cell layer can be applied to the present invention.

As shown in FIG. 1, the lower electrode separation groove $P_1$ is formed to penetrate through the lower electrode 200 so as to prevent the short circuit between the lower electrodes 200 of each photovoltaic cell. The lower electrode separation groove $P_1$ may be, for example, formed along a straight first line 220.

A plurality of the point type through-holes $P_2$ penetrating through the photoelectric conversion layer 300 and the upper electrode 400 are spaced from each other at a predetermined width instead of a straight line and formed on one side of the lower electrode separation groove $P_1$. The through hole $P_2$ is filled with a conductive material, so that the upper electrode 400 of a second cell may be connected with the lower electrode 200 of a first cell through the conductive material.

Adjacent photovoltaic cells $UC_1$ and $UC_2$ may be connected in series with each other through the conductive material filled in the through hole $P_2$. That is, the lower electrode 200 of the first cell $UC_1$ is connected with the upper electrode 400 of the second cell $UC_2$ through the conductive material filled in the through hole $P_2$, so that the first cell $UC_1$ is connected in series with the second cell $UC_2$.

Figure 2A:
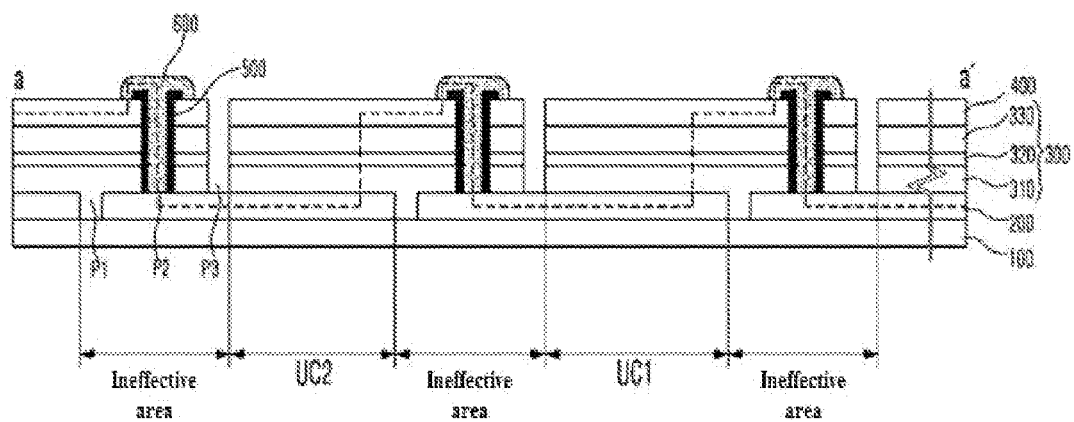
FIGS. 2a and 2b are cross sectional views taken along lines a-a' and b-b' of FIG. 1.

The aforementioned fact is shown in FIG. 2a that is a cross sectional view of the photovoltaic module taken along line a-a' of FIG. 1. As shown in FIG. 2a, the through hole $P_2$ is filled with the conductive material 600. The conductive material 600 contacts with the lower electrode 200 at the bottom surface of the through hole $P_2$, and contacts with the upper electrode 400 at the upper portion of the through hole $P_2$. Accordingly, the adjacent cells $UC_1$ and $UC_2$ can be connected in series with each other through the through holes $P_2$ formed to be spaced from each other.

According to the embodiment of the present invention, even though the intermediate reflector 320 is formed of a conductive material, it is possible to prevent leak current generated from the direct contact of the intermediate reflector 320 with the conductive material 600 filled in the through hole $P_2$. This can be obtained, as shown in FIG. 2a, by forming an insulating layer 500 on the side wall of the through hole $P_2$. As a result, the conductive material 600 filled in the through hole $P_2$ is electrically insulated from the intermediate reflector 320, so that leak current can be prevented. Consequently, fill factor of the photovoltaic module can be prevented from being reduced due to the leak current. Though FIG. 2a shows that the insulating layer 500 is formed on the entire side wall of the through hole $P_2$, the insulating layer 500 may be formed on only a side wall through which the intermediate reflector formed of the conductive material is exposed. The insulating layer 500 can be omitted when the photoelectric conversion layer 300 includes only one unit cell layer or the intermediate reflector 320 is not formed of the conductive material.

While it is described in this specification that the through hole $P_2$ is formed in the form of a point, this is just an example. As long as the plurality of the through holes $P_2$ are spaced from each other, this is included in the scope of the present invention. For example, the through hole $P_2$ may have a cut and divided straight line shape extending in one direction.

As described above, the photovoltaic module according to the embodiment of the present invention includes the lower electrode 200, the photoelectric conversion layer 300 and the upper electrode 400, and may include the plurality of the unit cells $UC_1$ and $UC_2$ connected in series with each other.

The upper separation groove $P_3$ is formed to penetrate through the photoelectric conversion layer 300 and the upper electrode 400, and then the photovoltaic cells $UC_1$ and $UC_2$ are separated. With the exception of a portion where the upper separation groove $P_3$ surrounds the point type through hole $P_2$ in a predetermined shape, the upper separation groove $P_3$ is formed to be overlapped with the path of the lower electrode separation groove $P_1$. For example, the upper separation groove $P_3$ may be formed along a second line 420.

Figure 2B:
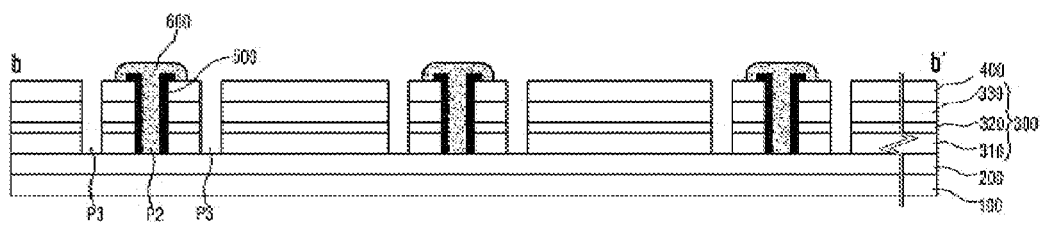

For the purpose of understanding the present invention, FIG. 2b shows a cross sectional view of the photovoltaic module taken along line b-b' of FIG. 1. As shown in FIG. 1, a portion of the upper separation groove $P_3$, which passes over the lower electrode separation groove $P_1$, extends up to the upper surface of the substrate 100. On the other hand, as shown in FIG. 2b, a portion of the upper separation groove $P_3$, which does not pass over the lower electrode separation groove $P_1$, extends only up to the upper surface of the lower electrode 200. This is because while the upper separation groove $P_3$ is formed to penetrate through the photoelectric conversion layer 300 and the upper electrode 400, the lower electrode 200 of the forming portion of the lower electrode separation groove $P_1$ has been already removed by the lower electrode separation groove $P_1$.

As described above, since the first line 220 in which the lower electrode separation groove $P_1$ is formed and the second line 420 in which the upper separation groove $P_3$ is formed are overlapped with each other with the exception of a particular area, the ineffective area of the photovoltaic module according to the embodiment of the present invention may be reduced. Also, since the through hole $P^2$, for connecting in series the unit cells within the photovoltaic module is formed separately from each other at a predetermined interval in the form of the point contact, the ineffective area of the photovoltaic module can be reduced. Therefore, the effective area compared to the same area is increased, so that a relative current value is increased.

Besides, according to the present invention, the photoelectric conversion layer 300 can be prevented from being oxidized or contaminated by being exposed to the air. Accordingly, the efficiency of the photovoltaic module can be prevented from being degraded due to the deterioration of the photoelectric conversion layer 300 by the contamination or the oxidization thereof.

In general, an electrode layer and the photoelectric conversion layer are formed in vacuum, and laser patterning for forming the lower electrode separation groove $P_1$, the through hole $P_2$ and the upper separation groove $P_3$ is performed in atmospheric air. As described above, according to the present invention, after the photoelectric conversion layer 300 and the upper electrode 400 are formed, the through hole $P_2$ and the upper separation groove $P_3$ are formed. Therefore, the substrate 100 on which the lower electrode 200, the photoelectric conversion layer 300 and the upper electrode 400 have been formed is exposed to the atmosphere in order to form the through hole $P^2$ and the upper separation groove $P_3$. Here, since the upper electrode 400 has been formed on the photoelectric conversion layer 300, the photoelectric conversion layer 300 can be prevented from being oxidized or contaminated by being directly exposed to the atmosphere during the exposure to the atmosphere for the purpose of the laser patterning and the like.

Hereafter, a manufacturing process of a photovoltaic module including the photovoltaic cells connected in series to each other by the point contact in accordance with the first embodiment of the present invention will be described in detail with reference to FIGS. 3a to 3g. Although FIGS. 3a to 3g show three photovoltaic cells, the photovoltaic module of the present invention may include a larger number of the cells.

Figure 3A:
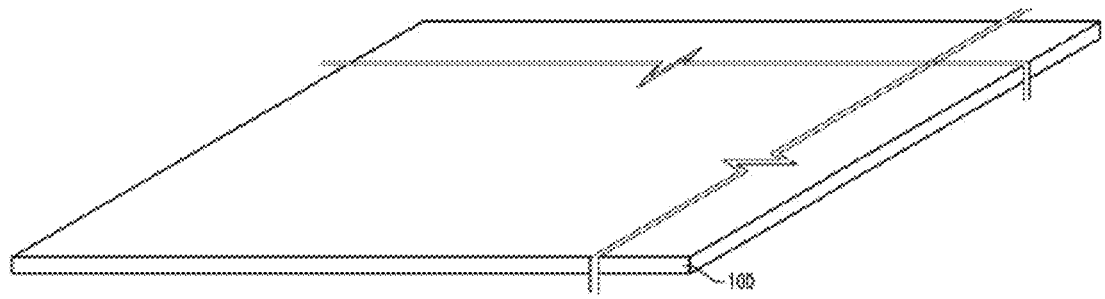
FIGS. 3a to 3g show a manufacturing process of the integrated thin-film photovoltaic module according to the embodiment of the present invention.

As shown in FIG. 3a, the substrate 100 is provided. The substrate 100 may be an insulating transparent substrate. When the photovoltaic module according to the embodiment of the present invention performs photoelectric conversion by light irradiated from the upper electrode 400, the substrate 100 may be an insulating opaque substrate. The substrate 100 may be a flexible substrate.

Figure 3B:
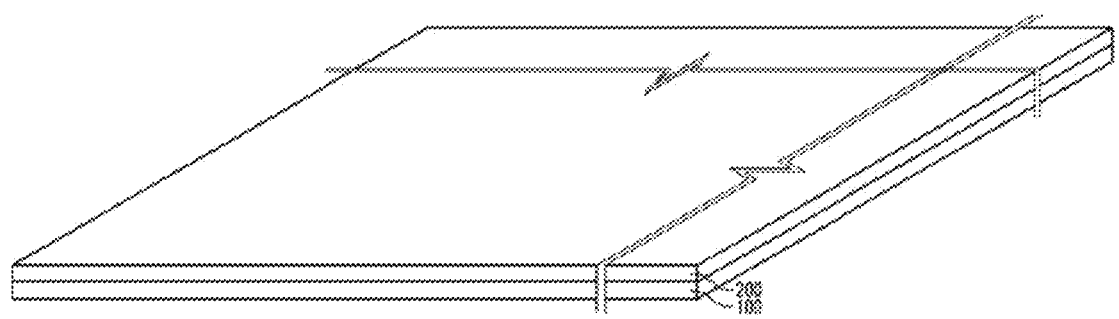

As shown in FIG. 3b, the lower electrode 200 is formed on the substrate 100. The lower electrode 200 may be a transparent conductive electrode including $SnO_2$, ZnO and ITO and the like. When the photovoltaic module according to the embodiment of the present invention performs photoelectric conversion by light irradiated from the upper electrode 400, the lower electrode 200 may be an opaque electrode.

Figure 3C:
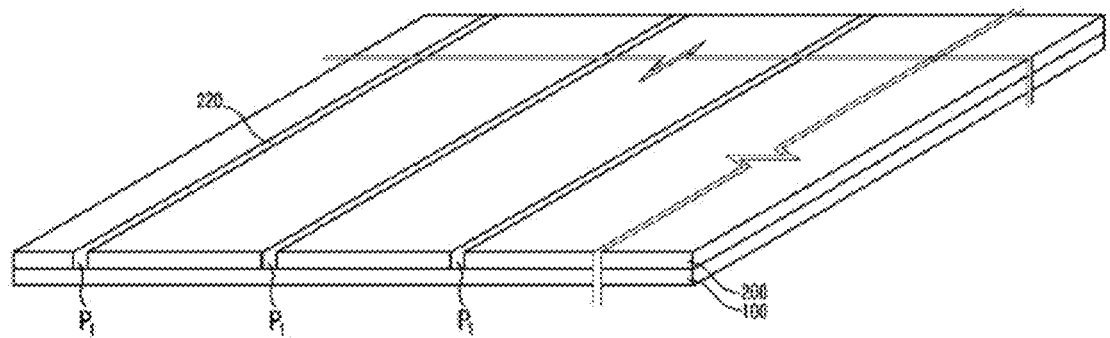

As shown in FIG. 3c, the lower electrode 200 is scribed by irradiating laser from the air to the lower electrode 200 or the substrate 100. The lower electrode separation groove $P_1$ separating the lower electrode 200 may be hereby formed, for example, along the straight first line 220. That is, the lower electrode 200 is separated by the lower electrode separation groove $P_1$, thereby preventing the short-circuit between the adjacent lower electrodes 200.

Figure 3D:
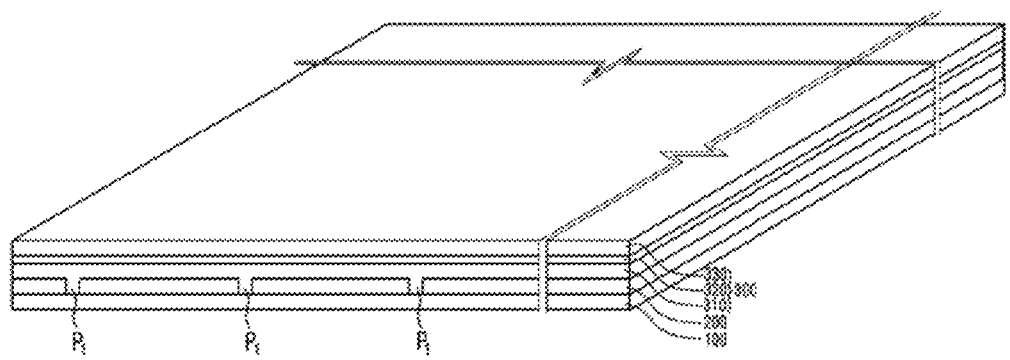

As shown in FIG. 3d, the photoelectric conversion layer 300 including the first unit cell layer 310, intermediate reflector 320 and the second unit cell layer 330 is formed on the lower electrode 200. Here, the photoelectric conversion layer 300 can be also formed in the lower electrode separation groove $P_1$.

The first unit cell layer 310 and the second unit cell layer 330 may include any material converting incident light energy into electrical energy. For example, the first and the second unit cell layers 310 and 330 include a photovoltaic material capable of forming a thin-film type photovoltaic module such as an amorphous silicon solar cell, a compound solar cell, an organic solar cell and a dye sensitized solar cell.

The intermediate reflector 320 reflects a part of light which has transmitted through a unit cell layer on which the light is first incident among the first unit cell layer and the second unit cell layer, to the unit cell layer on which light is first incident, and passes a part of the light through the other unit cell layer. As a result, the amount of the light absorbed by the unit cell layer on which the light is first incident is increased, so that electric current generated from the unit cell layer can be increased.

Here, among the first and the second unit cell layers, the optical band gap of one unit cell layer closer to a light incident side than the other may be larger than that of the other unit cell layer. For example, when light is incident through the substrate 100, the optical band gap of the first unit cell layer is larger than that of the second unit cell layer. This is because light with a short wavelength having a high energy density has a short light transmission distance, and a material having a larger optical band gap absorbs more light with a short wavelength.

Figure 3E:
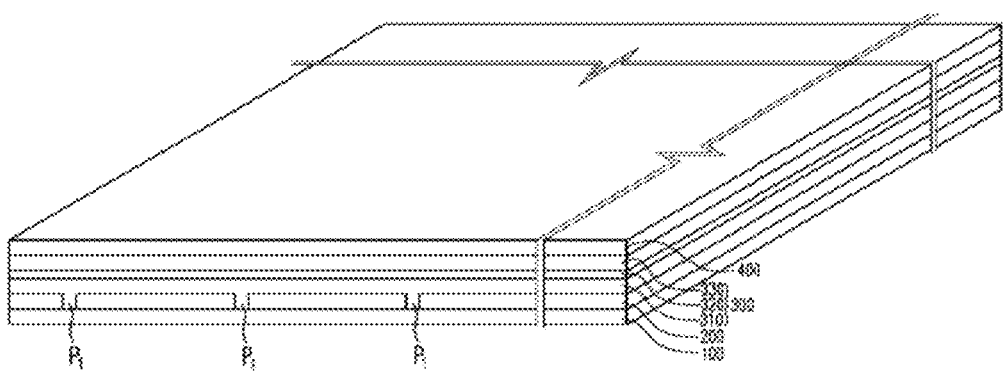

As shown in FIG. 3e, the upper electrode 400 is formed on the photoelectric conversion layer 300. The upper electrode 400 may include a conductive material which well reflects light and functions as an electrode. For example, the conductive material constituting the upper electrode 400 may include Al, Ag, Au, Cu, Zn, Ni, Pt, Pd and Cr and the like.

When the photovoltaic module according to the embodiment of the present invention performs photoelectric conversion by the light irradiated from the upper electrode 400, the upper electrode 400 can be formed of a transparent conductive material. In this case, the lower electrode 200 may include a conductive material which well reflects light and functions as an electrode.

Figure 3F:
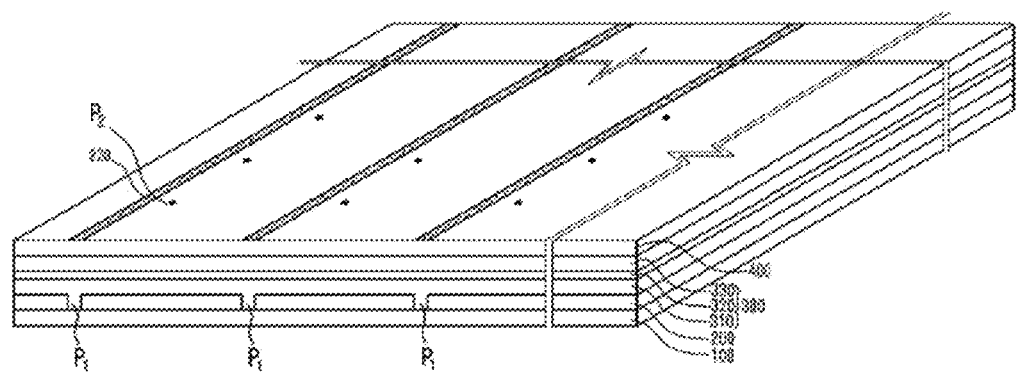

As shown in FIG. 3f, laser is irradiated from the atmosphere to the substrate 100 or the upper electrode 400, and then the photoelectric conversion layer 300 and the upper electrode 400 are scribed. As a result, a plurality of the through holes $P_2$ are spaced from each other and formed to penetrate through the photoelectric conversion layer 300 and the upper electrode 400. The plurality of the point type through holes $P_2$ are spaced from each other at a predetermined width and formed on one side of the lower electrode separation groove $P_1$. Through the through holes $P_2$ formed in such a manner, the unit cells within the photovoltaic module are connected in series to each other.

As shown in FIGS. 2a and 2b, the insulating layer 500 is coated on the inner side wall of the through hole $P_2$. The insulating layer 500 may be formed on only a portion through which the intermediate reflector of the photoelectric conversion layer 300 is exposed. Also, the insulating layer 500 may be coated on a portion through which the intermediate reflector and a conductive layer contacting with the intermediate reflector are exposed. The insulating layer 500 is designed to prevent leak current generated from the contact of the conductive layer in the photoelectric conversion layer 300 with the conductive material filled in the through hole $P_2$.

The insulating layer 500 may include insulating paste such as a $TiO_2$ nanoparticle, resin and carbon paste. The insulating layer 500 is coated on the side wall of the through hole $P_2$ by a printing method such as screen printing, inkjet printing and laser printing and the like a UV curing agent can be used as the insulating material. Therefore, the insulating layer 500 can be formed by printing the UV curing agent on the side wall of the through hole $P_2$ and performing UV curing. As a result, even when the intermediate reflector 320 is conductive, leak current by the intermediate reflector 320 can be prevented from being generated.

Next, as shown in FIGS. 2a and 2b, the conductive material 600 is filled in the through hole $P_2$ of which the side wall is coated with the insulating layer 500. The conductive material 600 is filled in such a manner as to contact with the lower electrode 200 at the bottom surface of the through hole $P_2$, and contact with the upper electrode 400 at the upper portion of the through hole $P_2$. The conductive material 600 is filled in the through hole $P^2$, by applying a conductive paste such as Ag paste or conductive polymer by using a printing method, for example, screen printing, inkjet printing and laser printing.

Figure 3G:
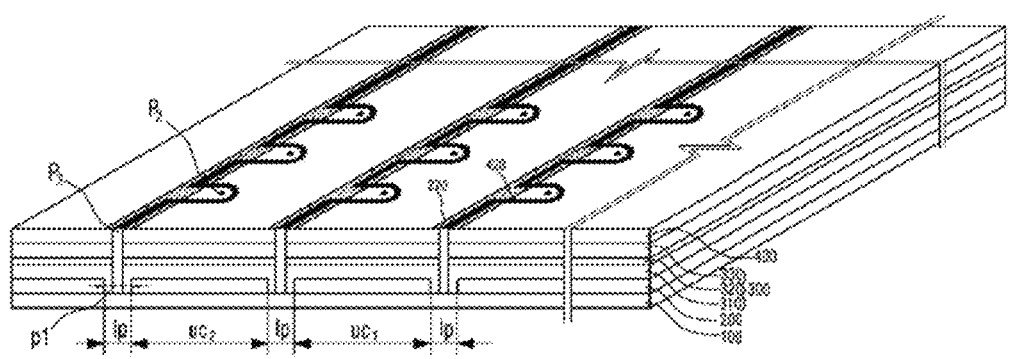

As shown in FIG. 3g, laser is irradiated from the atmosphere, and then the photoelectric conversion layer 300 and the upper electrode 400 are scribed. As a result, the upper separation groove $P_3$ penetrating through the photoelectric conversion layer 300 and the upper electrode 400 is formed along the second line 420. With the exception of a portion of the second line 420, which surrounds the point type through hole $P_2$, the second line 420 follows the same path as the first line 220 along which the lower electrode separation groove $P_1$ is formed. That is, with the exception of a portion of the upper separation groove $P_3$, which surrounds the through hole $P^2$, the upper separation groove $P_3$ is formed to pass over the lower electrode separation groove $P_1$. The unit cells $UC_1$ and $UC_2$ are defined by the upper separation groove $P_3$.

According to another embodiment of the present invention, the upper electrode 400 can be formed by a method of printing the patterned upper electrode in a non-vacuum environment. For example, the upper electrode patterned by the shapes of the through hole $P_2$ and the upper separation groove $P_3$ can be formed in a non-vacuum environment on the photoelectric conversion layer 300 by a printing method such as laser printing, inkjet printing and screen printing and the like. Since the patterned upper electrode is formed in the atmosphere not in vacuum, manufacturing cost can be reduced.

Here, it is possible to form the through hole $P_2$ after forming the upper separation groove $P_3$. It is also possible to form the insulating layer 500 and the conductive material 600 in the through hole $P^2$ after forming the upper separation groove $P_3$ and the through hole $P_2$.

In the manufacturing process described above of the photovoltaic module according to the embodiment of the present invention, while it is described that the lower electrode separation groove $P_1$ is formed along the first line 220 and the upper separation groove $P_3$ is formed along the second line 420, it is also possible that the lower electrode separation groove $P_1$ is formed along the second line 420 and the upper separation groove $P_3$ is formed along the first line 220.

Here, a ratio of an overlapped length of the upper separation groove and the lower electrode separation groove to the length of the first line may be equal to or greater than 0.70 and equal to and less than 0.96. When the ratio is less than 0.70, the ineffective area is increased, so that electric current cannot sufficiently rise and manufacturing time may be increased. When the ratio is greater than 0.96, the path of the electron is increased, so that an electrical resistance and Joule heat are increased, and then fill factor of the photovoltaic module may be reduced.

Besides, in FIG. 1 and the manufacturing process described above of the photovoltaic module according to the embodiment of the present invention, while it is described that the width of the lower electrode separation groove $P_1$ is greater than that of the upper separation groove $P_3$, this is just an example. It is also possible that the width of the lower electrode separation groove $P_1$ may be equal to or less than that of the upper separation groove $P_3$.

In the photovoltaic module including the photovoltaic cells connected in series to each other by the point contact in accordance with the one embodiment of the present invention, it is important that an appropriate number of the through holes $P_2$ be formed. When the number of the through hole $P_2$ is very large, the ineffective area is increased like the straight line type laser scribing, so that electric current cannot sufficiently rise. Moreover, since the upper separation groove $P_3$ formed by the laser scribing is formed to surround the through hole $P_2$, manufacturing time may be increased. When the number of the through holes $P_2$ is very small, a path through which the electron should move is increased, so that the electrical resistance and Joule heat are increased and then fill factor may be reduced. Therefore, it is necessary to optimize the number of the through holes $P_2$ and the distance between the plurality of the through holes $P_2$ formed between the two adjacent unit cells.

Figure 4:
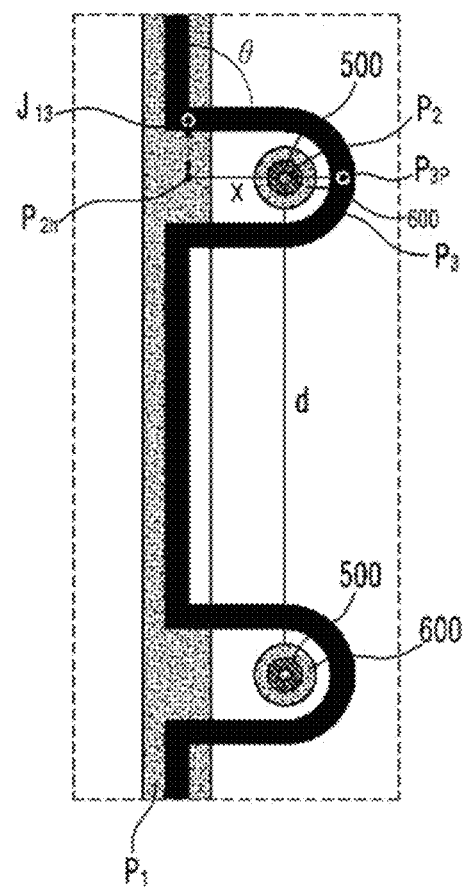
FIG. 4 shows an enlarged view of a dotted-line quadrangular part "A" of FIG. 1 according to the embodiment of the present invention.

FIG. 4 shows an enlarged view of a dotted-line quadrangular part "A" of FIG. 1. "d" represents a distance between the two adjacent through holes $P_2$. "x" represents a distance between the first line 220 and the through hole $P_2$. "$P_{2h}$" represents a foot of perpendicular, which extends from the through hole $P_2$ to the first line 220. "$J_{13}$" represents a branch point from which the lower electrode separation groove $P_1$ and the upper separation groove $P_3$ branch from each other. "r" represents a distance between the $P_{2h}$ and $J_{13}$.

As shown in FIG. 4, the second line 420 is overlapped with the first line 220 with the exception of the areas surrounding the through hole $P_2$. That is, the second line 420 branches off from the point "$J_{13}$" on the first line 220, which is spaced from the foot of perpendicular "$P_{2h}$" at a predetermined distance "r" and surrounds the through hole $P_2$, and then may return to another point on the first line 220, which is spaced from the foot of perpendicular "$P_{2h}$" at the predetermined distance "r".

Here, the second line 420 may be located in the middle between the foot of perpendicular "$P_{2h}$," and the outermost point "$P_{3p}$" from the first line 220. A distance between the second line 420 and the foot of perpendicular "$P_{2h}$" is represented by "2x".

In the photovoltaic module according to the first embodiment of the present invention, the distance "2x" may be equal to or greater than 200 μm and equal to or less than 300 μm. As long as the distance "2x" is maintained within the range, it is possible not only to prevent a short-circuit among the lower electrode separation groove $P_1$, the through hole $P_2$ and the upper separation groove $P_3$ but also to prevent the size of the ineffective area from being unnecessarily increased.

In the photovoltaic module according to the first embodiment of the present invention, it is recommended that a distance "d" between the through holes $P_2$ be equal to or greater than 1 mm and equal to or less than 5 cm. Here, a ratio of the distance "2x", i.e., the distance between the second line 420 and the foot of perpendicular "$P_{2h}$" to the distance "d" between the through holes $P_2$ may be equal to or greater than $4 \times 10^{-3}$ and equal to or less than $300 \times 10^{-3}$. When the distance "d" is less than 1 mm, the ineffective area is increased, so that electric current cannot sufficiently rise and manufacturing time may be increased. When the distance "d" is greater than 5 cm, a path through which the electron should move to the lower electrode is increased, so that the electrical resistance and Joule heat are increased and then fill factor of the photovoltaic module may be reduced.

The unit cells $UC_1$ and $UC_2$ of the photovoltaic module according to the embodiment of the present invention have a width which is equal to or greater that 6 mm and equal to or less than 15 mm. When the width of the cell is less than 6 mm, the ineffective area is increased and the value of the open circuit voltage (Voc) generated by one module becomes larger, so that installation cost is increased. When the width of the cell is greater than 15 mm, the electrical resistance increases and the efficiency of the manufactured photovoltaic module is degraded.

In the module, when a remaining area which is obtained by removing semiconductors and conductors for the purpose of edge isolation and performs photoelectric conversion is referred to as an effective area, in the photovoltaic module according to the embodiment of the present invention, the ineffective area by the laser scribing to the effective area may be equal to greater than 0.007% and equal to or less than 1.5%.

In the photovoltaic module according to the first embodiment of the present invention, a shape in which the second line 420 surrounds the through hole $P_2$ can be determined such that an electron path from the through hole $P_2$ to the second line 420 becomes as short as possible. When the electron path from the through hole $P_2$ to the upper separation groove $P_3$ surrounding the through hole $P_2$ is as short as possible, minimum heat can be generated. The shape is formed to have the same distance from the through holes $P_2$, thereby minimizing the ineffective area generated therefrom. For example, the upper separation groove $P_3$ surrounding the through hole $P_2$ may have a partial circular shape. For example, the second line 420 surrounds the through hole $P_2$ in the form of the partial circular shape.

As shown in FIG. 4, the insulating layer 500 is coated on the side wall of the through hole $P_2$, and the conductive material 600 is filled in the through hole $P_2$. FIG. 4 shows that the conductive material 600 is formed wider than the width of the through hole $P_2$ in the upper portion of the through hole $P_2$. This intends to describe that the conductive material 600 contacts with the upper electrode 400 in the upper portion. When the through hole $P_2$ is filled with the conductive material 600, it is enough as long as the conductive material 600 is formed contacting with the upper electrode surrounded by the second line 420.

Figure 5A:
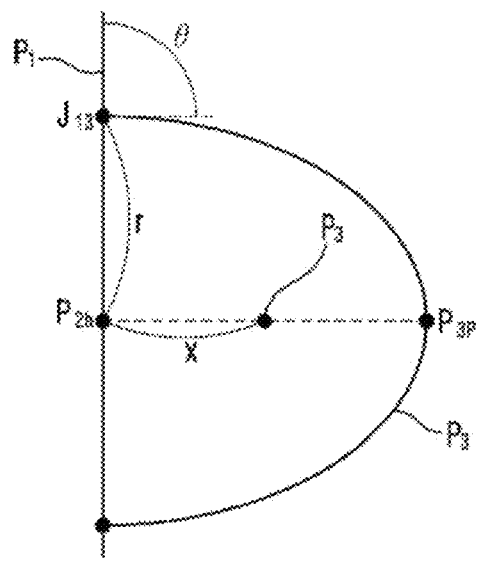
FIGS. 5a to 5c show a shape of a second line surrounding a through-hole according to the embodiment of the present invention.
Figure 5B:
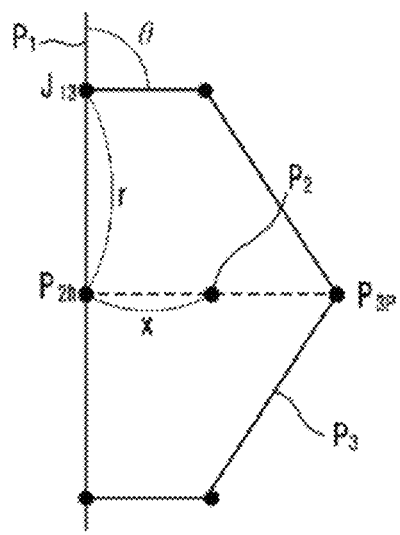
Figure 5C:
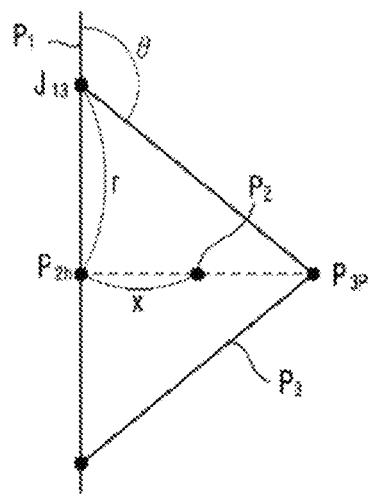

FIGS. 5a to 5c show another example of a shape in which the upper separation groove $P_3$ surrounds the through hole $P_2$ in the photovoltaic module according to the embodiment of the present invention.

FIG. 5a shows that the second line 420 branches off from the branch point "$J_{13}$" on the first line 220 and surrounds the through hole $P_2$ along a partial ellipse. Here, the through hole $P_2$ may be located in the middle between the foot of perpendicular "$P_{2h}$" and the outermost point "$P_{3p}$," of the second line 420. When the second line 420 surrounds the through hole $P_2$ along the partial ellipse or circle, distances from the through hole $P_2$ to the second line 420 are somewhat uniform and the ineffective area can be reduced.

FIGS. 5b and 5c show that the second line 420 surrounds the through hole $P_2$ in a partial pentagon and triangle. It can be noted that also when the second line 420 surrounds the through hole $P_2$ in such shapes, the ineffective area can be reduced and the distances from the through hole $P_2$ to the second line 420 are somewhat uniform.

However, the shapes shown above are just examples. The specific shapes of the photovoltaic module according to the embodiment of the present invention may be a partial polygon including the pentagon or triangle. Here, only when all of the interior angles of the polygon are less than 180°, the ineffective area can be efficiently reduced. Also, it is recommended that the polygon be symmetrical with respect to a line connecting the foot of perpendicular "$P_{2h}$", the through hole $P_2$ and the outermost point "$P_{3p}$". Also, it is desirable that all of the interior angles of the polygon be equal to or greater than 90°, because when the interior angle of the polygon is an acute angle, the laser beam is focused on the same vertex, so that, patterning is excessively done or the photoelectric conversion layer and an electrode layer may be damaged by heat.

However, an angle "θ" formed at the branch point "$J_{13}$" by the first line 220 and the second line 420 may be equal to or greater than 90° and equal to or less than 135°. For example, when the shape is a partial circle or ellipse, an angle formed by the first line 220 and a tangent line at the branch point "$J_{13}$" of the circle or the ellipse is equal to or greater than 90° and equal to or less than 135°. When the shape is the partial polygon described above, an external angle of the polygon at the branch point "$J_{13}$" may be equal to or greater than 90° and equal to or less than 135°. When the angle "θ" is less than 90°, the distance between the second line 420 and the through hole $P_2$ are increased and the ineffective area cannot be efficiently reduced. Also, when the angle "θ" is greater than 135°, the width of the second line 420 surrounding the through hole $P_2$ is increased and the effect of reducing the ineffective area is degraded.

Also, a point shape of the through hole $P_2$ may have a circular shape, an elliptical shape or a polygonal shape in accordance with the shape surrounding the through hole $P_2$. The shape of the through hole $P_2$ can be obtained as described below with reference to FIGS. 7a to 7c by using a mask having a predetermined pattern formed therein such that the laser beam which has passed through a homogenizer can be selectively transmitted. As such, the shape of the through hole $P_2$ is matched to the shape surrounding the through hole $P_2$, thereby reducing and uniformizing the path through which the electron moves from the through hole $P_2$ through the lower electrode to the second line 420 surrounding the through hole $P_2$.

Figure 6A:
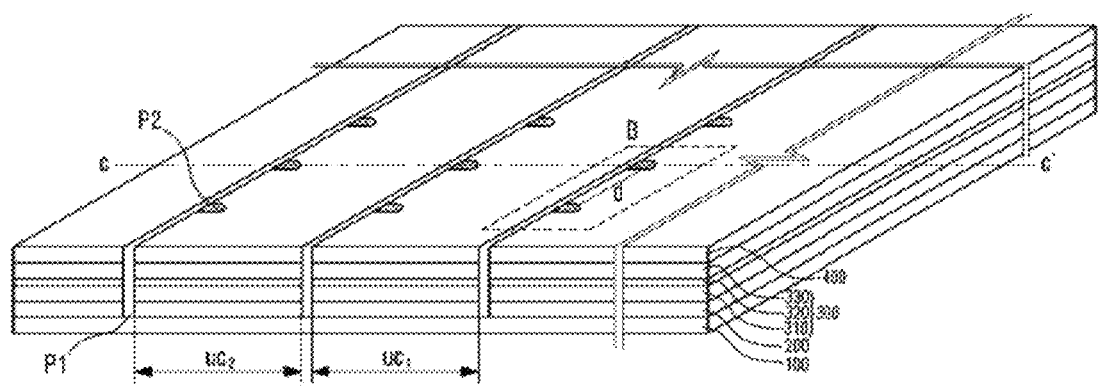
FIG. 6a is a perspective view showing an integrated thin-film photovoltaic module including photovoltaic cells which are connected in series through a point contact in accordance with a second embodiment of the present invention.

FIG. 6a is a perspective view showing an integrated thin-film photovoltaic module including photovoltaic cells which are connected in series through a point contact in accordance with a second embodiment of the present invention. Hereafter, the description of the photovoltaic module in FIGS. 1 to 3g according to the first embodiment of the present invention will be omitted, and the second embodiment of the present invention will be described focusing on differences from the first embodiment.

In a photovoltaic module according to the second embodiment of the present invention, the paths of the lower electrode separation groove and the upper separation groove, all of which have been described in FIG. 1, are identical to each other. This is the same as a case where the upper separation groove is formed to pass over the lower electrode separation groove.

In other words, in the photovoltaic module according to the second embodiment of the present invention, the separation groove $P_1$ penetrates through the lower electrode 200, the photoelectric conversion layer 300 and the upper electrode 400, and forms a plurality of the cells.

A plurality of the point type through-holes $P_2$ penetrating through the photoelectric conversion layer 300 and the upper electrode 400 are spaced from each other at a predetermined width instead of a straight line and formed on one side of the separation groove $P_1$. Here, a portion of the through hole $P_2$ is formed contacting with the separation groove $P_1$. That is, the through hole $P_2$ has a shape of which a portion has been cut by the separation groove $P_1$. For example, in the photovoltaic module according to the second embodiment of the present invention, the through hole $P_2$ may have a cylindrical shape of which a portion has been cut by the separation groove $P_1$.

The through hole $P_2$ is filled with the conductive material, so that the upper electrode 400 of the second cell may be connected with the lower electrode 200 of the first cell through the conductive material. Here, since there is no boundary between the through hole $P_2$ and the separation groove $P_1$, the conductive material can be filled not only in the through hole $P_2$ but also in a portion of the separation groove $P_1$, which contacts with the through hole $P_2$.

Figure 6B:
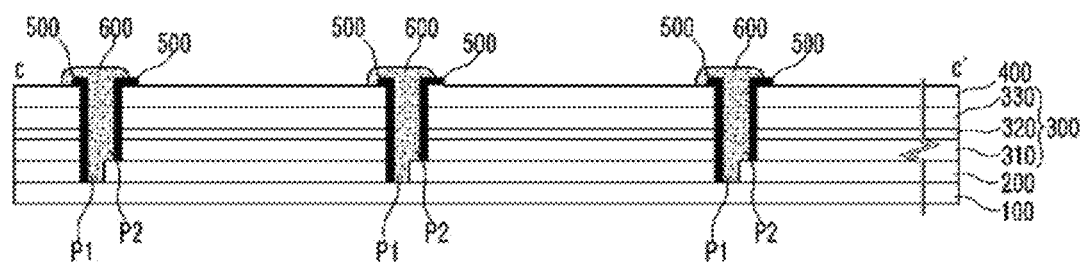

FIG. 6b is a cross sectional view taken along line c-c' of the photovoltaic module shown in FIG. 6a. As shown in FIG. 6b, a portion of the through hole $P_2$ contacts with the separation groove $P_1$, so that the through hole $P_2$ and the separation groove $P_1$ form a space. Here, the lower electrode 200 is exposed just in the lower portion of the through hole $P_2$.

The conductive material 600 is filled with the through hole $P_2$ and in a portion of the separation groove $P_1$, which contacts with the through hole $P_2$. The conductive material 600 contacts with the lower electrode 200 of one cell at the bottom surface of the through hole $P_2$, and contacts with the upper electrode 400 of another cell adjacent to the one cell at the upper portion of the through hole $P_2$. Here, it should be noted that the conductive material 600 does not contact with the upper electrode 400 of the one cell. Because since, unlike the first embodiment, the upper separation groove is not formed to surround the through hole $P_2$, the upper electrodes of the two adjacent cells may be short-circuited due to the conductive material 600.

Additionally, with regard to the intermediate reflector 320 formed of the conductive material, the insulating layer 500 may be included on the side wall of the through hole $P_2$ and on the side wall of the other cell side exposed by the separation groove filled with the conductive material so as to prevent leak current due to the intermediate reflector.

Figure 6C:
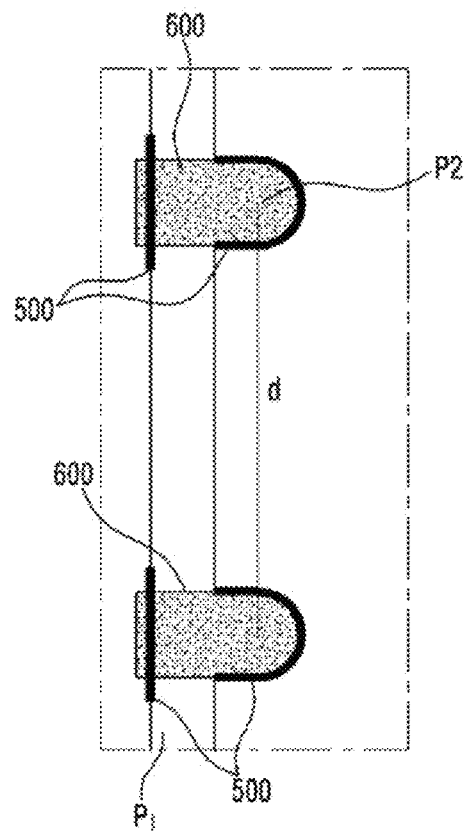

FIG. 6c shows an enlarged view of a dotted-line quadrangular part "B" of FIG. 6a. As shown in FIG. 6c, the through hole $P_2$ is incorporated to allow the one portion of the through hole $P_2$ to contact with the separation groove $P_1$. The conductive material 600 is filled in the through hole $P_2$ and in a portion of the separation groove $P_1$, which contacts with the through hole $P_2$. Here, the insulating layer 500 is coated on the side wall except the one portion of the through hole $P_2$ for the purpose of preventing the conductive material from contacting with the intermediate reflector of the photoelectric conversion layer 300. The insulating layer 500 is also coated on a portion of the side wall of the other cell side exposed by the separation groove $P_1$, which faces the through hole $P_2$, so that the conductive material can be prevented from contacting with the intermediate reflector.

Here, in order to make sure that the conductive material 600 does not contact with the intermediate reflector 320, it is shown that the insulating layer 500 is coated wider than the width of the formed conductive material 600. However, this is only one embodiment, and the insulating layer 500 can have any shape capable of preventing the conductive material 600 from contacting with the intermediate reflectors of the two adjacent cells.

While the case where the separation groove $P_1$ is formed to have a straight line shape and the through hole $P_2$ is formed on one side of the separation groove $P_1$ has been described in the foregoing description, it is possible that the separation groove $P_1$ follows a path connecting the mutually spaced through holes $P_2$ with each other, and surrounds the one side of the through hole $P_2$ at only a portion where the through hole $P_2$ has been formed.

As described above, according to the second embodiment of the present invention, since the paths of the lower electrode separation groove and the upper separation groove are identical to each other, the ineffective area can be reduced. Accordingly, since the effective area compared to the same area is increased, a relative current value is increased.

In the manufacturing process described above of the photovoltaic module according to the embodiment of the present invention, at least one of the separation grooves $P_1$ and $P_3$ and the through hole $P_2$ can be formed by laser scribing. A laser processing machine (not shown) performing the laser scribing may include a homogenizer such that the intensity distribution of a laser beam oscillated from a laser oscillator are uniformized in a laser beam irradiation area. The homogenizer may be formed through a combination of spherical lenses or formed of an optical fiber cable which utilizes total reflection characteristics.

Figure 7A:
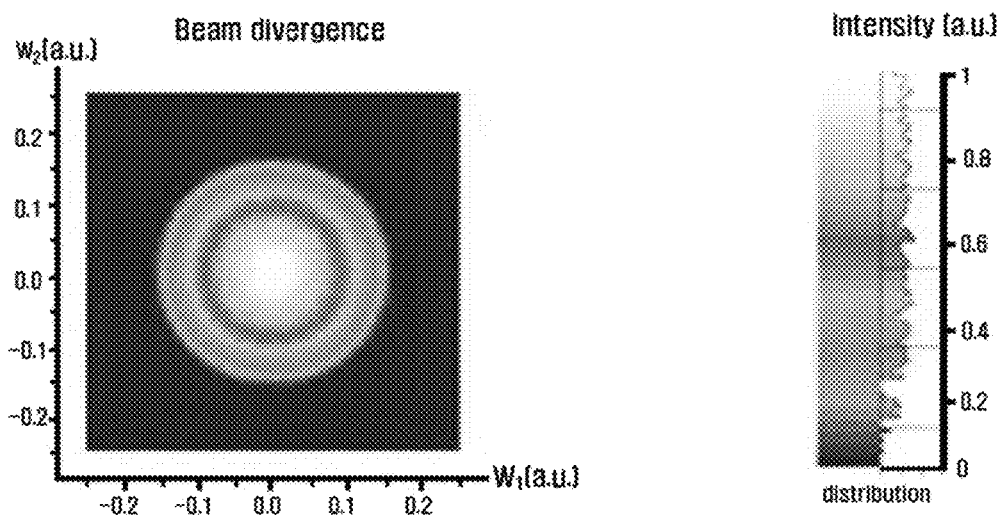
FIGS. 7a and 7b show intensity distributions of a laser beam before and after passing through a homogenizer and show pattern surfaces according to the intensity distributions.
Figure 7B:
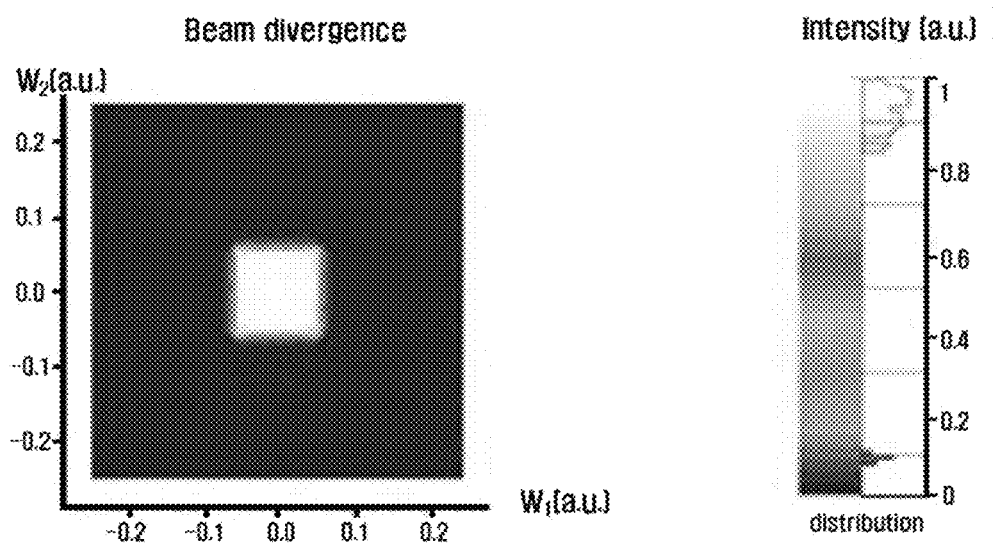

Referring to FIGS. 7a and 7b, when a laser beam which is oscillated from the laser oscillator and has a Gaussian intensity distribution passes through the homogenizer, the laser beam becomes to have a uniform intensity distribution. Additionally, referring to FIGS. 7a and 7b, it can be understood that a pattern surface formed by using the laser beam having a Gaussian intensity distribution (FIG. 7a) is much more irregular than a pattern surface formed by using a laser beam which passes through the homogenizer and has a uniform intensity distribution (FIG. 7b).

In other words, when the intensity distribution of a laser beam becomes uniform, pattern surfaces of the separation grooves formed by irradiating the laser beam is substantially uniformly formed. Accordingly, it is possible to minimize the generation of burr in the side walls of the separation grooves and/or the through holes $P_1$, $P_2$ and $P_3$, so that an integrated thin-film photovoltaic module having improved efficiency can be manufactured. Further, by using the laser beam which has passed through the homogenizer, it is possible to prevent the peripheral photoelectric conversion layer and characteristics of the electrode from being changed by laser power for desired insulation characteristics.

Additionally, the laser processing machine may include a mask having a predetermined pattern formed therein, which allows the laser beam which has passed through the homogenizer to be selectively transmitted therethrough. As a result, only a laser beam area showing a desired uniform intensity distribution can be used to form the separation groove or the through hole.

Figure 7C:
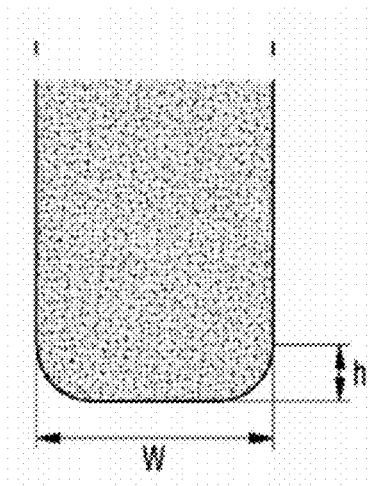
FIG. 7c shows a section of a pattern formed by the laser beam which has passed through the homogenizer.

FIG. 7c shows a cross of either the separation groove pattern or the through hole pattern which is formed according to the embodiment of the present invention. Here, it is recommended that a ratio of a level difference "h" of the bottom surface of the pattern to the width "W" of the pattern be equal to or greater than 5% and equal to or less than 10%. Then the ratio of the level difference "h" of the bottom surface of the pattern to the width "W" of the pattern is greater than 10%, the edge of the pattern is not sufficiently removed and leak current may be generated. In order that the ratio of the level difference "h" to the width "W" of the pattern may be less than 5%, an excessive laser power is added. As a result, the peripheral photoelectric conversion layer and the characteristics of the electrode may be changed.

While the embodiment of the present invention has been described with reference to the accompanying drawings, it can be understood by those skilled in the art that the present invention can be embodied in other specific forms without departing from its spirit or essential characteristics. Therefore, the foregoing embodiments and advantages are merely exemplary and are not to be construed as limiting the present invention. The present teaching can be readily applied to other types of apparatuses. The description of the foregoing embodiments is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. An integrated thin-film photovoltaic module, comprising:
    a first cell and a second cell, the first cell and the second cell each comprising a lower electrode, a photoelectric conversion layer, and an upper electrode disposed on a substrate,
    a separation groove comprising a lower electrode separation groove separating the lower electrode of the first cell and the second cell;
    through holes penetrating the upper electrode and the photoelectric conversion layer in each of the first cell and the second cell, the through holes being spaced apart from each other in each of the first cell and the second cell; and
    a conductive material filling the through holes and connecting the upper electrode of the second cell and the lower electrode of the first cell.

2. The integrated thin-film photovoltaic module of claim 1, wherein the photoelectric conversion layer comprises a first unit cell layer, a second unit cell layer, and an intermediate reflector disposed between the first unit cell layer and the second unit cell layer.

3. The integrated thin-film photovoltaic module of claim 2, wherein a side wall of each through holes is coated with an insulating layer.

4. The integrated thin-film photovoltaic module of claim 3, wherein:
    the separation groove comprises an upper separation groove separating the photoelectric conversion layer and the upper electrode of the first cell from the photoelectric conversion layer and the upper electrode of the second cell; and
    a first portion of the upper separation groove overlaps the lower electrode separation groove.

5. The integrated thin-film photovoltaic module of claim 4, wherein one of the lower electrode separation groove and the upper separation groove is disposed along a straight line extending in a direction parallel to the substrate.

6. The integrated thin-film photovoltaic module of claim 5, wherein a ratio of the length of the first portion of the upper separation groove overlapping the lower electrode separation groove to the length of the separation groove formed along the straight line extending parallel to the substrate is in the range of 0.70 to 0.96.

7. The integrated thin-film photovoltaic module of claim 5, wherein, in a second portion of the separation groove where the upper separation groove and the lower electrode separation groove do not overlap, one of the lower electrode separation groove and the upper separation groove has a partial circular shape or a partial elliptical shape.

8. The integrated thin-film photovoltaic module of claim 7, wherein, at a branch point from which the upper separation groove and the lower electrode separation groove diverge from each other, an angle formed by the straight line and a tangent line of the partial circular shape or the partial elliptical shape is in the range of 90° to 135°.

9. The integrated thin-film photovoltaic module of claim 5, wherein, in a second portion of the separation groove where the upper separation groove and the lower electrode separation groove do not overlap, one of the lower electrode separation groove and the upper separation groove has a partial polygonal shape.

10. The integrated thin-film photovoltaic module of claim 9, wherein:
    at a branch point from which the upper separation groove and the lower electrode separation groove diverge from each other,
    an external angle of the partial polygonal shape is in the range of 90° to 135°; and
    all of the interior angles of the partial polygonal shape are less than 180°.

11. The integrated thin-film photovoltaic module of claim 5, wherein, each through hole is disposed in a second portion of the separation groove where the upper separation groove and the lower electrode separation groove do not overlap and is located at the center of a line connecting an outermost point of the separation groove with respect to the straight line of each cell and a foot of perpendicular from the outermost point.

12. The integrated thin-film photovoltaic module of claim 5, wherein:
two adjacent through holes are spaced from each other; and
a ratio of a distance between a foot of perpendicular extending from the through hole to the straight line to a distance between the two adjacent through holes is in the range of $4 \times 10^{-3}$ to $300 \times 10^{-3}$.

13. The integrated thin-film photovoltaic module of claim 4, wherein widths of the first cell and the second cell are in the range of 6 mm to 15 mm, respectively.

14. The integrated thin-film photovoltaic module of claim 4, wherein a distance between two adjacent through holes among the through holes is in the range of 1 mm to 5 cm.

15. The integrated thin-film photovoltaic module of claim 4, wherein, a ratio of an area surrounded by the lower electrode separation groove and the upper separation groove including the through hole therebetween is in the range of 0.007% to 1.5% of an area of the integrated thin-film photovoltaic module.

16. The integrated thin-film photovoltaic module of claim 4, wherein each of the through holes has a circular shape, an elliptical shape, or a polygonal shape.

17. The integrated thin-film photovoltaic module of claim 4, wherein at least one of the lower electrode separation groove, the through holes, and the upper separation groove is patterned to have a curved edge so that a ratio of level difference of the curved edge to a width of a pattern is in the range of 5% to 10%.

* * * * *